(12) United States Patent
Nguyen et al.

(10) Patent No.: US 7,558,075 B2
(45) Date of Patent: Jul. 7, 2009

(54) ACCESSING AN INTERIOR OF AN ELECTRONIC SYSTEM

(75) Inventors: Minh H. Nguyen, Katy, TX (US); David A. Selvidge, Cypress, TX (US); Qiang Wang, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 532 days.

(21) Appl. No.: 11/389,787

(22) Filed: Mar. 27, 2006

(65) Prior Publication Data

US 2007/0223207 A1  Sep. 27, 2007

(51) Int. Cl.
*H05K 7/14* (2006.01)
*H05K 7/18* (2006.01)

(52) U.S. Cl. .................. 361/801; 361/756; 361/727

(58) Field of Classification Search ......... 361/800–802, 361/809, 683–686, 679, 727, 737, 741, 752, 361/756, 790, 797; 312/223
See application file for complete search history.

(56) References Cited

U.S. PATENT DOCUMENTS

| 5,557,499 A | * | 9/1996 | Reiter et al. | 361/685 |
| 6,362,416 B1 | * | 3/2002 | Denny et al. | 174/365 |
| D541,285 S | * | 4/2007 | Wang et al. | D14/445 |

* cited by examiner

*Primary Examiner*—Hung S Bui

(57) ABSTRACT

An interior of an electronic system is accessed by manipulating a latch mechanism to release a handle attached to a drawer disposed within a housing of the electronic system; operating the handle to extend the drawer at least partially out of the housing; further manipulating the latch mechanism to release a door that obscures an interior of the drawer; and shifting the door to expose the interior of the drawer.

20 Claims, 8 Drawing Sheets

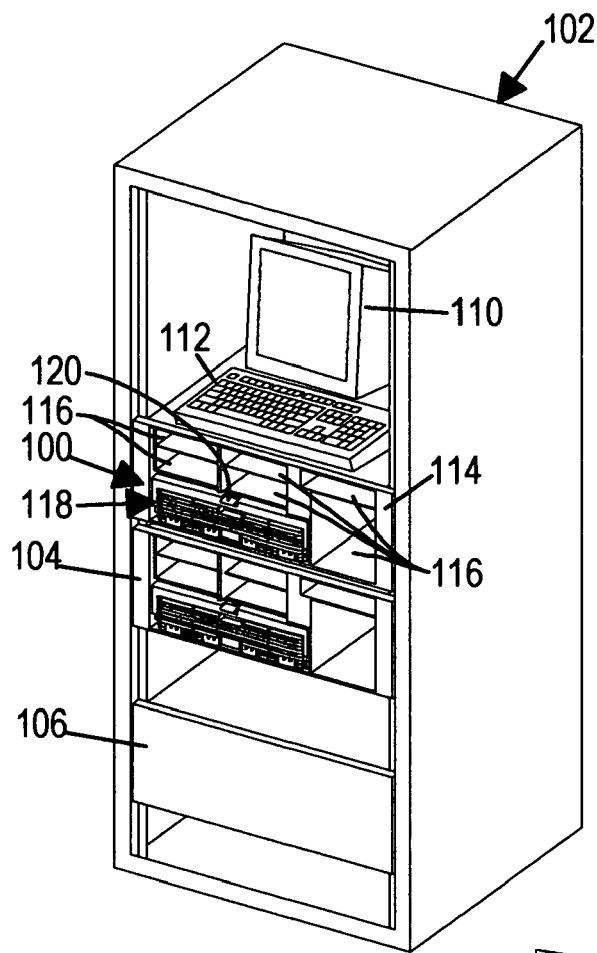
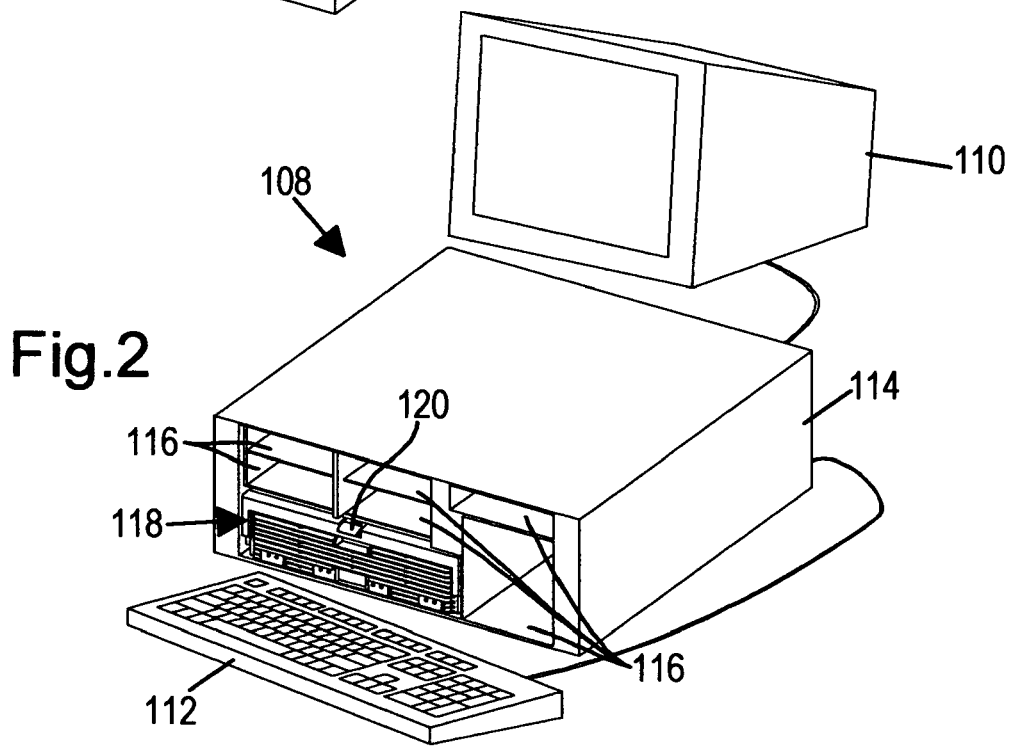

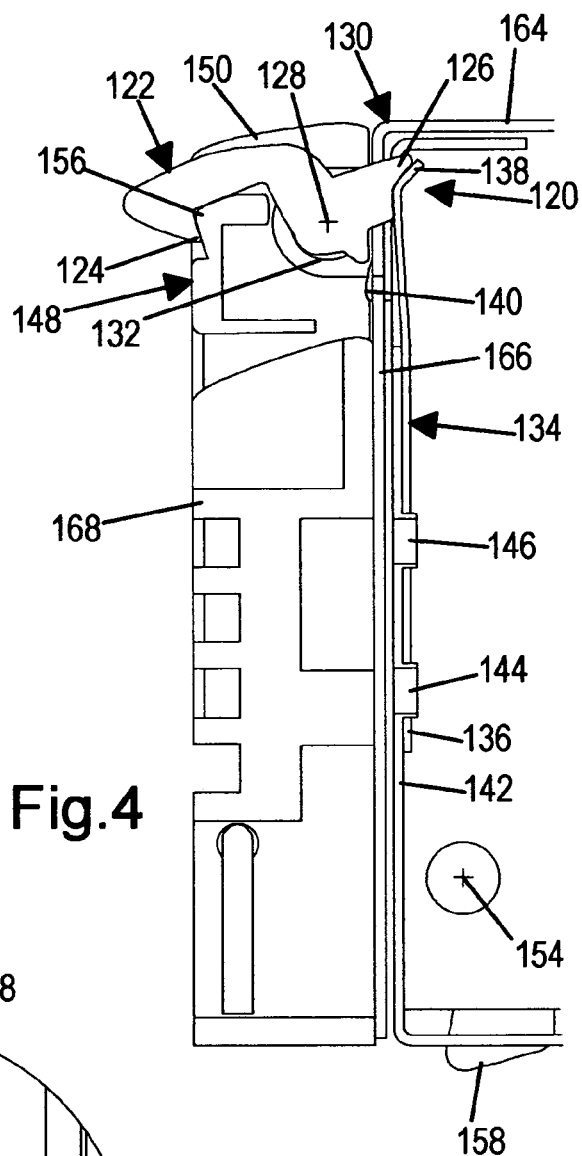
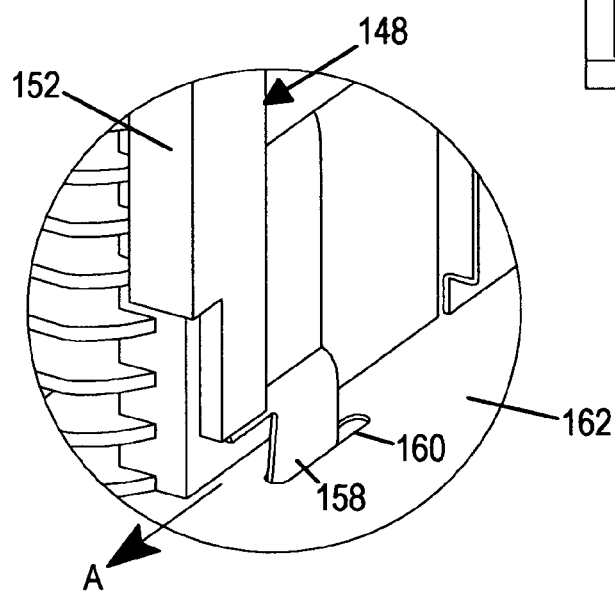
Fig.4
Fig.5

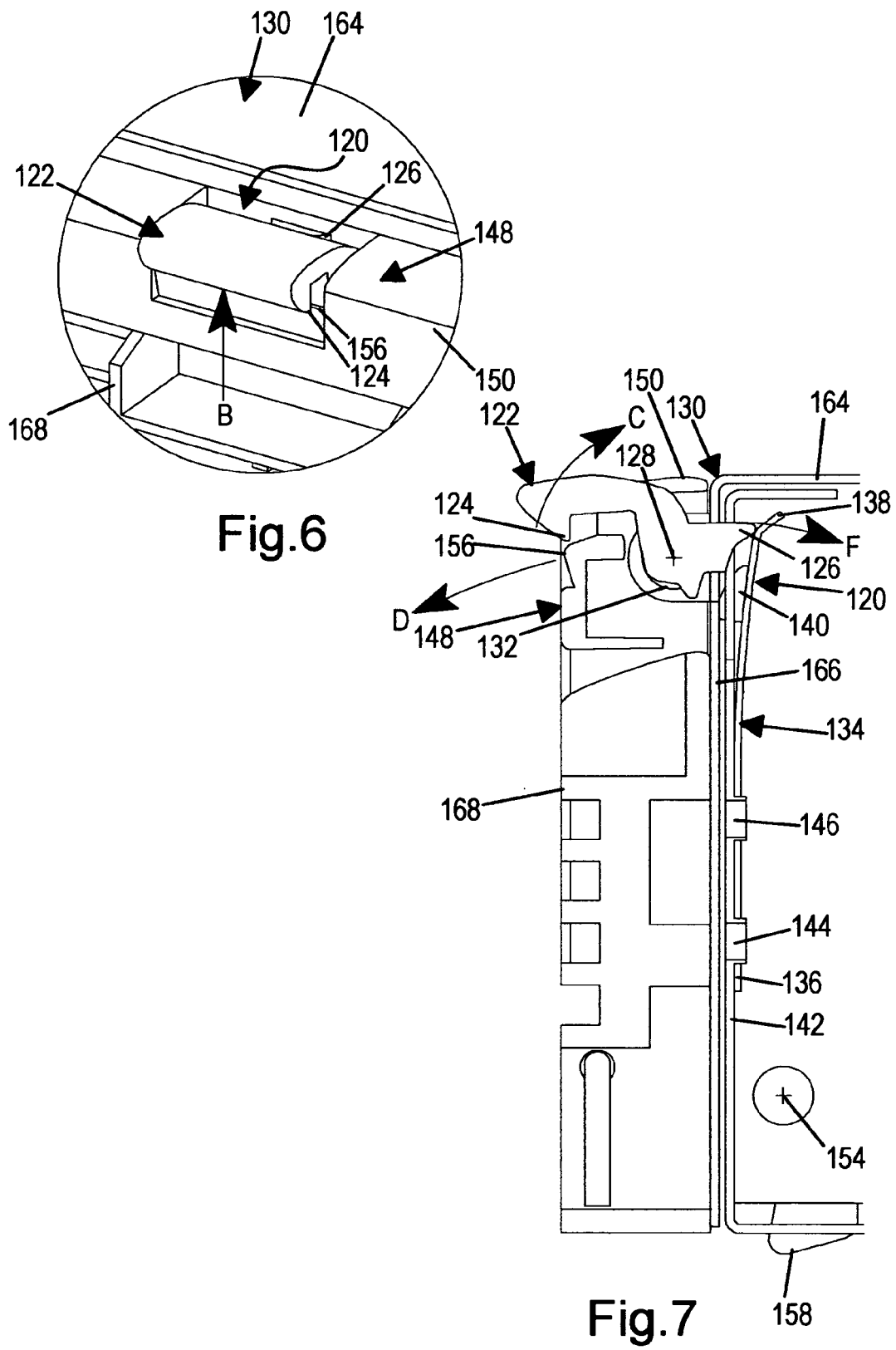

ACCESSING AN INTERIOR OF AN ELECTRONIC SYSTEM

BACKGROUND

The interior of an electronic system, such as a computer system, must be accessible to a user of the system. Such accessibility is necessary so that the user can service, change or reconfigure internal components of the system. If it is difficult or time consuming to open the system, then the system may be undesirable for the user's needs. This undesirability may be particularly significant in an enterprise having many systems, such as a computer server "farm," since the user may have to open several systems at a time to service or upgrade each system at once. In such a situation, a time consuming system-opening procedure may result in significant time and cost for the user or the owner of the systems.

BRIEF DESCRIPTION OF THE DRAWINGS

FIG. 1 is a perspective view of an exemplary rack-mounted system having an exemplary electronic system incorporating an embodiment of the present invention.

FIG. 2 is a perspective view of another exemplary electronic system incorporating an embodiment of the present invention.

FIG. 4 is a side cross section of a portion of the electronic system shown in FIG. 1 according to an embodiment of the present invention.

FIG. 5 is an enlarged perspective view of another portion of the electronic system shown in FIG. 1 according to an embodiment of the present invention.

FIG. 6 is an enlarged perspective view of a portion of the electronic system shown in FIG. 1 according to an embodiment of the present invention.

FIG. 7 is another side cross section of a portion of the electronic system shown in FIG. 1 according to an embodiment of the present invention.

DETAILED DESCRIPTION

Figure 3:
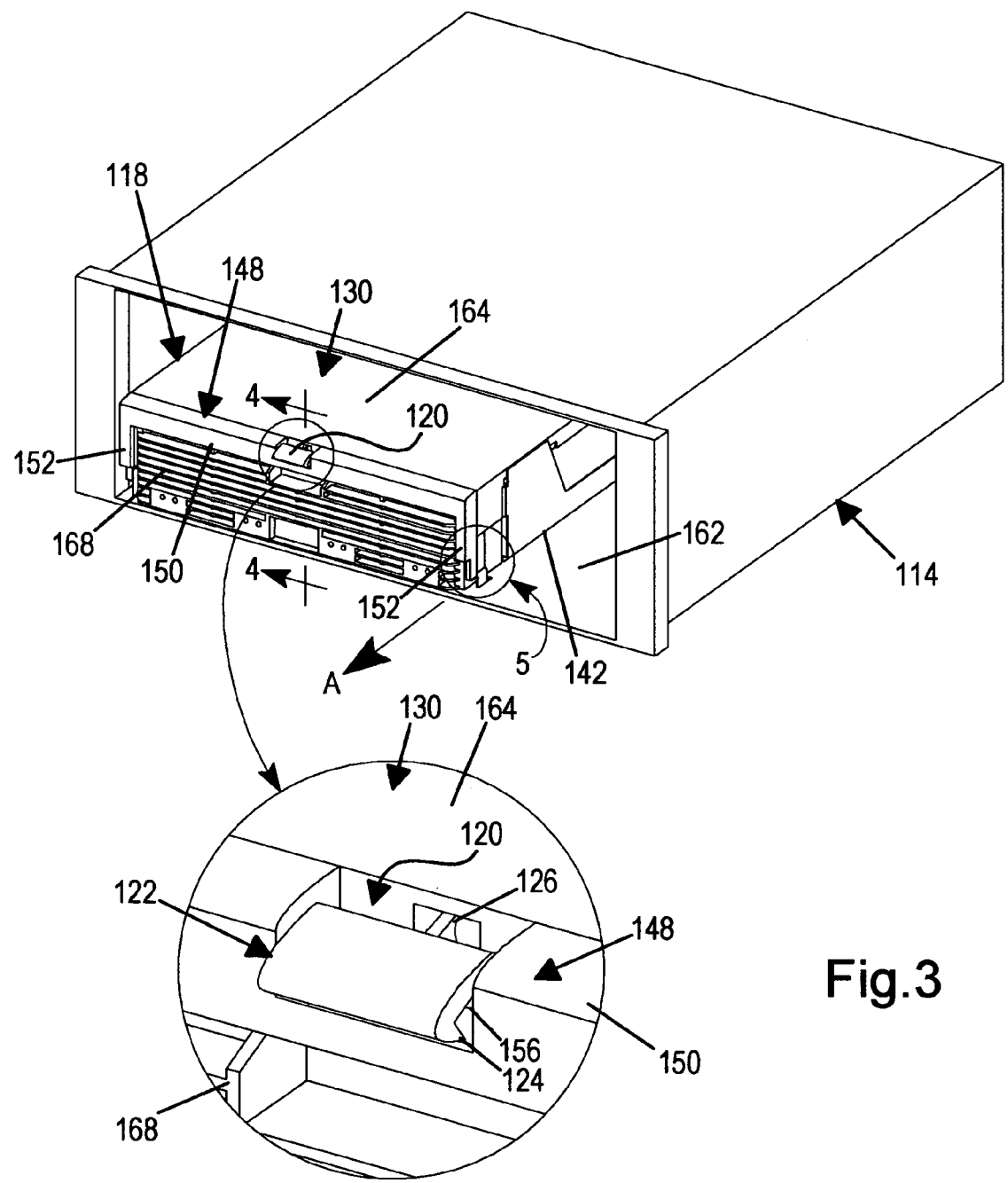
FIG. 3 is a perspective view of portions of the exemplary electronic system shown in FIG. 1 according to an embodiment of the present invention.

An exemplary electronic system 100 incorporating an embodiment of the present invention is shown in FIG. 1 within an exemplary rack-mounted system 102. The rack-mounted system 102 may have additional devices 104 and 106 installed therein for a variety of purposes. The electronic system 100 may be a computerized device, or other appropriate rack-based electronic device having some or all of the features and functions described herein. An alternative exemplary electronic system 108 incorporating an embodiment of the present invention is shown in FIG. 2. The electronic system 108 may also be a computerized device, such as a desktop computer, or other appropriate electronic device having some or all of the features and functions described herein.

The electronic systems 100 and 108 generally have a variety of elements, including, but not limited to, an optional display 110, an optional keyboard 112 and a housing 114. The interior of the housing 114 contains optional device bays 116, various electronic/mechanical components and a sliding extendible/insertable component drawer 118. At least some of the various electronic/mechanical components are disposed in the interior of the component drawer 118.

The components within the component drawer 118 are relatively easily accessible for the user, because a latch mechanism 120 on the component drawer 118 quickly allows for the release of both a handle (for pulling the component drawer 118 at least partially out of the housing 114) and a door (for shielding the components within the component drawer 118), as described below. In this manner, access to at least a portion of the interior of the electronic system 100 or 108 is quickly and easily achieved, so that the user can service, change or reconfigure internal components of the electronic system 100 or 108.

Although the present invention is described herein with respect to its use in the electronic system 100 or 108, which is shown as a rack-based or desktop computer system, it is understood that the invention is not so limited. Rather, the present invention may be used in any appropriate electronic system that includes a sliding extendible/insertable component drawer, regardless of any other elements included or not included in the electronic system. For ease of description, only the electronic system 100 will be referred to hereafter.

The latch mechanism 120, as shown in FIGS. 3 and 4, has a pivoting portion 122 that has a hooked end 124 and a protruding end 126 and a point 128 about which it pivots between various positions. (FIG. 4 is a cross section taken along section lines 4-4 in FIG. 3.) At the pivot point 128, the pivoting portion 122 is attached to a door 130 by a hinge 132. The latch mechanism 120 also has a latch spring portion 134 with a fixed end 136, a distal end 138 and protruding portions 140. The latch spring portion 134 is fixed to a base portion 142 of the component drawer 118 at 144 and 146.

The component drawer 118 includes a handle 148. The handle 148 has a gripping portion 150 and two arms 152 that extend to a pivot point 154. At the pivot point 154, the handle 148 is hingedly attached to the base portion 142 of the component drawer 118. The hooked end 124 of the pivoting portion 122 of the latch mechanism 120, in the "first" position shown in FIGS. 3 and 4, can engage the handle 148 at a hooking portion 156 to secure the handle 148 in the position shown. The handle 148 is, thus, in a stowed position.

When the handle 148 is in the position shown in FIGS. 3, 4 and 5, hooks 158, or other appropriate shapes, at the bottom of the arms 152 can engage holes 160 in a base 162 of the housing 114, as shown in FIG. 5. (FIG. 5 is an enlargement of a portion 5 of FIG. 3) In this manner, the hooks 158 and the holes 160 prevent the component drawer 118 from moving forward (direction of arrow A) in the housing 114. Additionally, a component (not shown) in the component drawer 118 may be frictionally engaged in a receiving receptacle in the housing 114, thereby preventing the component drawer 118 from moving backward (opposite direction of arrow A) in the housing 114. Thus, the hooks 158 secure the component drawer 118 against the receiving receptacle in the housing 114 to prevent movement of the component drawer 118 relative to the housing 114.

The connection between the component and the receiving receptacle may also serve as a communications connector between the electronic components in the component drawer 118 and other components in the housing 114. For example, the component drawer 118 may have an I/O board with a first communications connector, and the housing 114 may have a system 1/0 board with a mating second communications connector that aligns with and receives the first communications connector when the component drawer 118 is inserted into the housing 114.

The door 130 includes a top portion 164 and a front portion 166. The front portion 166 has a vented front panel 168 attached thereto. The top portion 164 of the door 130, in the position shown in FIGS. 3 and 4, shields the interior of the component drawer 118. The protruding portions 140 of the latch spring portion 134 of the latch mechanism 120 engage the front portion 166 of the door 130 at holes therein. In this manner, the door 130 is held secure in the position shown, since the protruding portions 140 do not permit the door 130 to move upward.

Upon manipulation of the pivoting portion 122 of the latch mechanism 120 in the direction of arrow B, as shown in FIG. 6, the hooked end 124 of the pivoting portion 122 clears the hooking portion 156 of the handle 148, as shown in FIG. 7, to release the handle 148. The pivoting portion 122 is, thus, pivoted about pivot point 128 in the direction of arrow C from the first position shown in FIG. 4 to the "second" position shown in FIG. 7. In this position of the pivoting portion 122, the handle 148 is free to pivot about pivot point 154 in the direction of arrow D in FIG. 7 (arrow E in FIG. 8). Additionally, the protruding end 126 of the pivoting portion 122 may engage the distal end 138 of the latch spring portion 134 to slightly bend the distal end 138 in the direction of arrow F. In doing so, however, the protruding portions 140 of the latch spring portion 134 do not clear the holes in the front portion 166 of the door 130, so the door 130 is not released, but remains secured.

Figure 8:
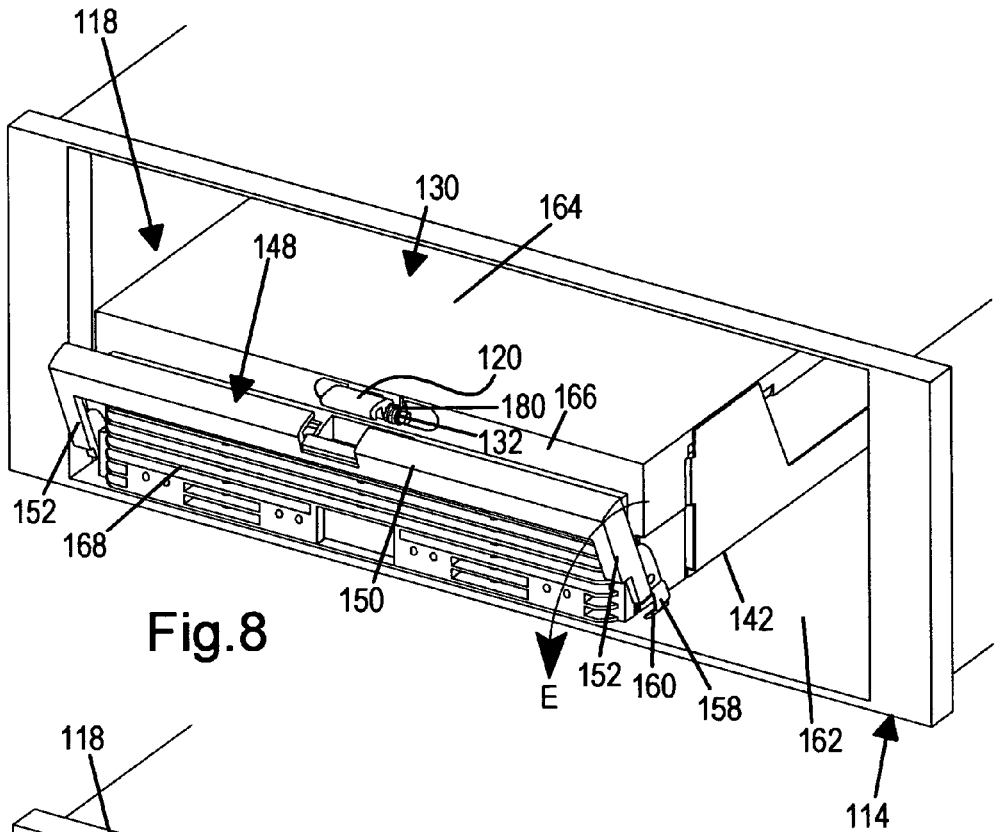
FIG. 8 is another perspective view of portions of the exemplary electronic system shown in FIG. 1 according to an embodiment of the present invention.
Figure 9:
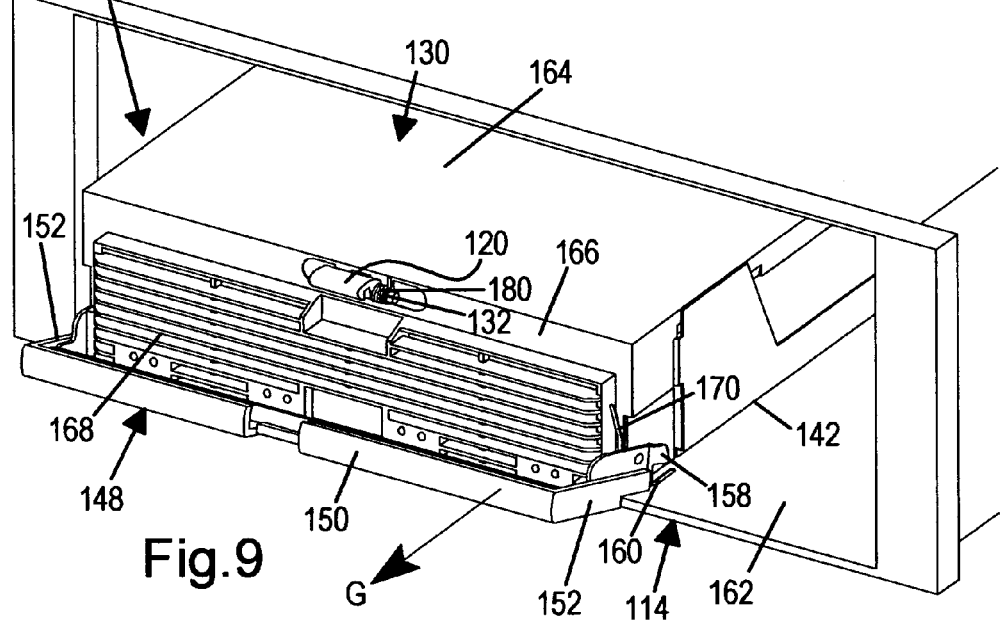
FIG. 9 is yet another perspective view of portions of the exemplary electronic system shown in FIG. 1 according to an embodiment of the present invention.
Figure 10:
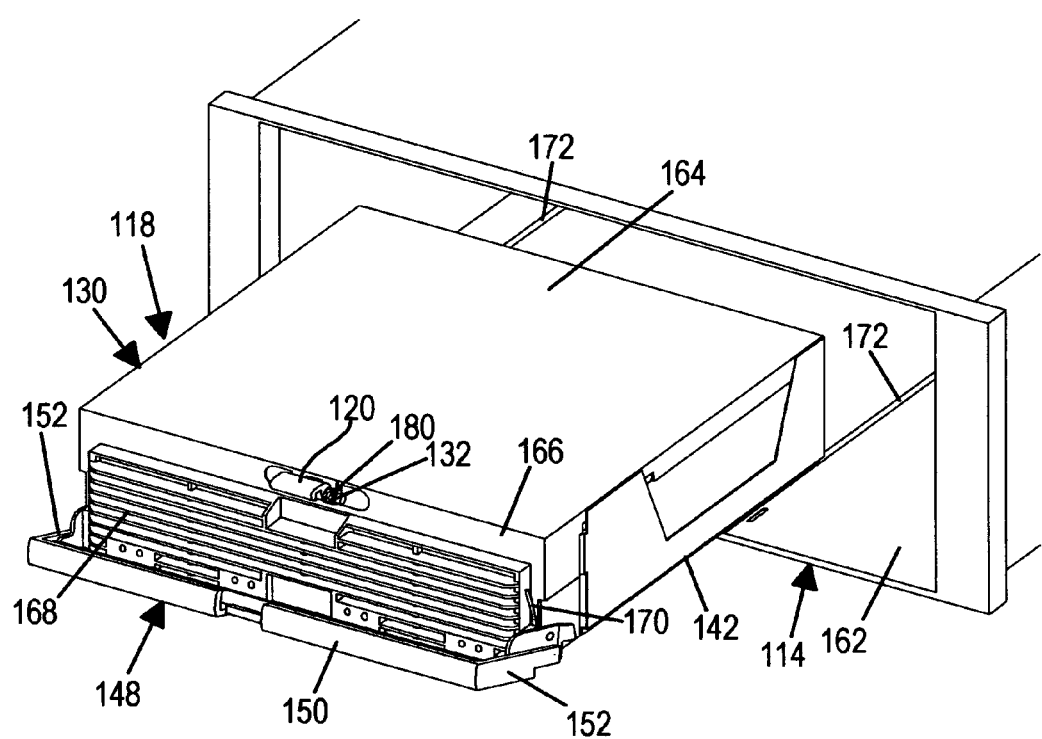
FIG. 10 is still another perspective view of portions of the exemplary electronic system shown in FIG. 1 according to an embodiment of the present invention.

Upon release of the handle 148, a bent spring 170 (visible in FIG. 9) attached to the front portion 166 of the door 130 pushes on the arms 152 of the handle 148 to push the handle 148 at least partially in the direction of arrow E, as shown in FIG. 8. With the handle 148, thus, at least partially shifted away from the stowed position to an operable position, the user can grip the gripping portion 150 of the handle 148 to operate the handle 148 to extend the component drawer 118 in the direction of arrow G, as shown in FIG. 9. The component drawer 118 is, thus, extended at least partially out of the housing 148, as shown in FIG. 10.

The component drawer 118 may be mounted on rails, tracks, grooves or other appropriate guiding mechanisms 172 within the housing 114 to guide the component drawer 118 into and out of the housing 114 and to secure the component drawer 118 from side-to-side movement. Alternatively, the housing 114 may have a fixed cage surrounding the inserted position of the component drawer 118. The fixed cage may confine the component drawer 118 to prevent side-to-side or up-down movement. The fixed cage may also have an appropriate guiding mechanism to guide the component drawer 118 in front-to-back movement.

Additionally, pressing down on the handle 148 to the operable position shown in FIG. 9 causes the hooks 158 at the bottom of the arms 152 to press against the holes 160 in the base 162 of the housing 114. Thus, the component drawer 118 is cammed slightly forward. This camming action gives additional leverage for the component (not shown) in the component drawer 118 to be frictionally disengaged from the receiving receptacle in the housing 114. In this manner, the component drawer 118 is released from the inserted position in the housing 114, so the user can easily extend the component drawer 118 at least partially out of the housing 114.

Although, it is shown that the component drawer 118 extends horizontally straight out of a front of the housing 114, it is understood that the invention is not so limited. Instead, the component drawer 118 may also extend vertically up or down or extend horizontally out of a side or a rear of the housing 114 or extend rotationally out of the housing 114.

Upon extending the component drawer 118 to the position shown in FIG. 10, the component drawer 118 may remain physically connected to and cantilevered out from the housing 114. Alternatively, the component drawer 118 may be completely removed from the housing 114 and carried by the handle 148.

Figure 11:
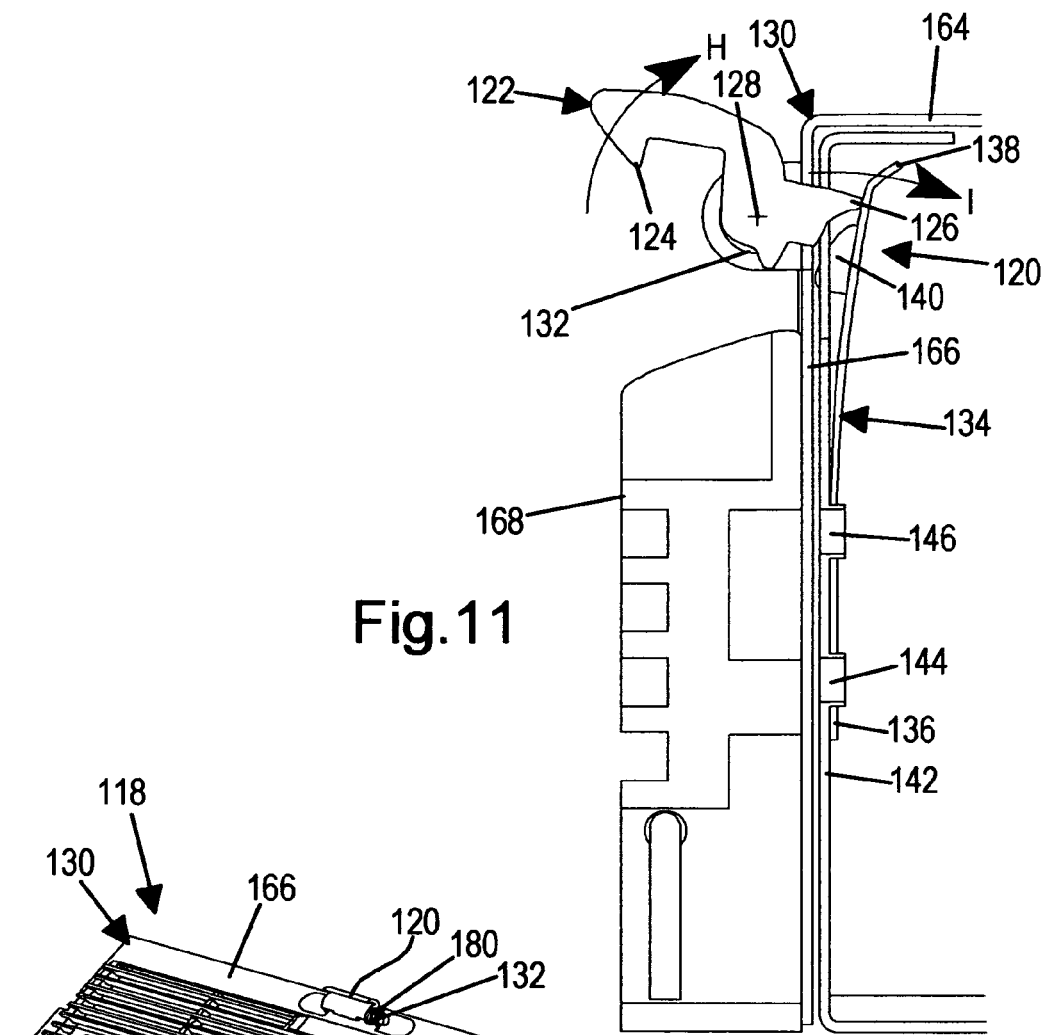
FIG. 11 is another side cross section of a portion of the electronic system shown in FIG. 1 according to an embodiment of the present invention.
Figure 12:
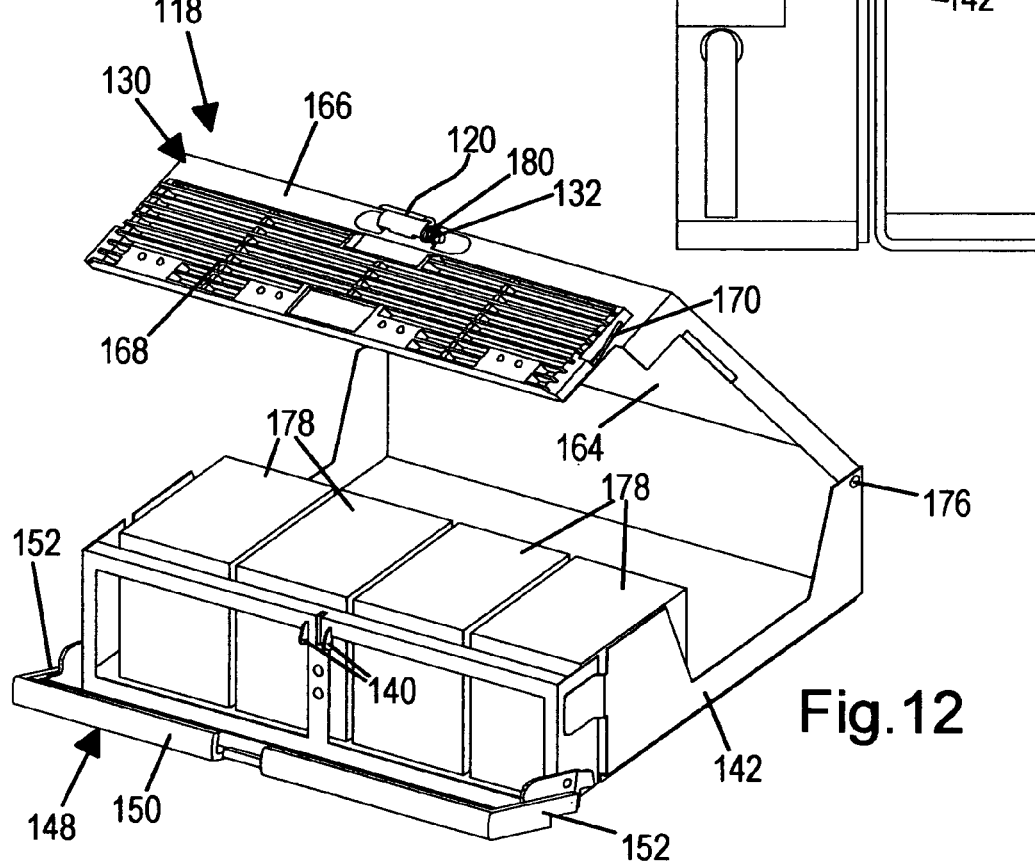
FIG. 12 is a perspective view of a component drawer for use in the exemplary electronic system shown in FIG. 1 according to an embodiment of the present invention.

To open the component drawer 118, the user manipulates the pivoting portion 122 from the first or second position shown in FIG. 4 or 7, respectively, to the "third" position shown in FIG. 11. In other words, the pivoting portion 122 is further pivoted about pivot point 128 in the direction of arrow H. (The handle 148 is not shown in FIG. 11 for clarity.) In doing so, the protruding end 126 of the pivoting portion 122 engages the distal end 138 of the latch spring portion 134 to bend the distal end 138 in the direction of arrow I. In this manner, the protruding portions 140 of the latch spring portion 134 clear the holes in the front portion 166 of the door 130, so the door 130 is released and free to pivot about pivot point 176. Lifting up on the pivoting portion 122 or on any part of the door 130 then raises the door 130 from the closed position shown in FIG. 10 to about the open position shown in FIG. 12. The interior of the component drawer 118 and components 178 therein are thus exposed. Such components 178 may be any appropriate electrical or mechanical elements, such as CPU (central processing unit) modules, VRMs (voltage regulator modules), PPMs (processor power modules), memory modules, power supplies, expansion cards, etc. The door 130 may then be held up by any appropriate means, while the user accesses the interior of the component drawer 118.

After opening the door 130, the user may release the pivoting portion 122 of the latch mechanism 120. When the pivoting portion 122 is released, a hinge spring 180 (FIGS. 8, 9, 10 and 12) mounted about hinge 132 forces the pivoting portion 122 back to the first position shown in FIG. 4. The latch spring 134 is, thus, also released to return to the position shown in FIG. 4.

After the user is finished accessing the interior of the component drawer 118, the door 130 is lowered back onto the base portion 142 of the component drawer 118. In so doing, the front portion 166 of the door 130 slides down on a tapered forward edge of the protruding portions 140 of the latch spring 134, so that the distal end 138 bends slightly backward until the holes in the front portion 166 align with the protruding portions 140. Thus, the protruding portions 140 reengage the front portion 166 at the holes therein and secure the door 130 in the closed position.

Once the door 130 has been lowered back onto the base portion 142 of the component drawer 118, the user can push the component drawer 118 back to about the inserted position. The handle 148 can then be raised back up to the stowed position. In so doing, the hooking portion 156 of the handle 148 pushes on a tapered forward side of the pivoting portion 122 to slightly pivot the pivoting portion 122 up until the hooking portion 156 aligns with the hooked end 124 of the pivoting portion 122. The force of the hinge spring 180 then snaps the pivoting portion 122 down onto the handle 148, so the handle 148 is secured in the stowed position, as shown in FIG. 4. Additionally, raising the handle 148 to the stowed position provides leverage for the hooks 158 at the bottom of the arms 152 to engage the holes 160 in the base 162 of the housing 114 to cam the component drawer 118 into frictional engagement with the receiving receptacle in the housing 114. In this manner, the component drawer 118 is returned to the inserted position within the housing 114 of the exemplary electronic system 100.

Figure 13:
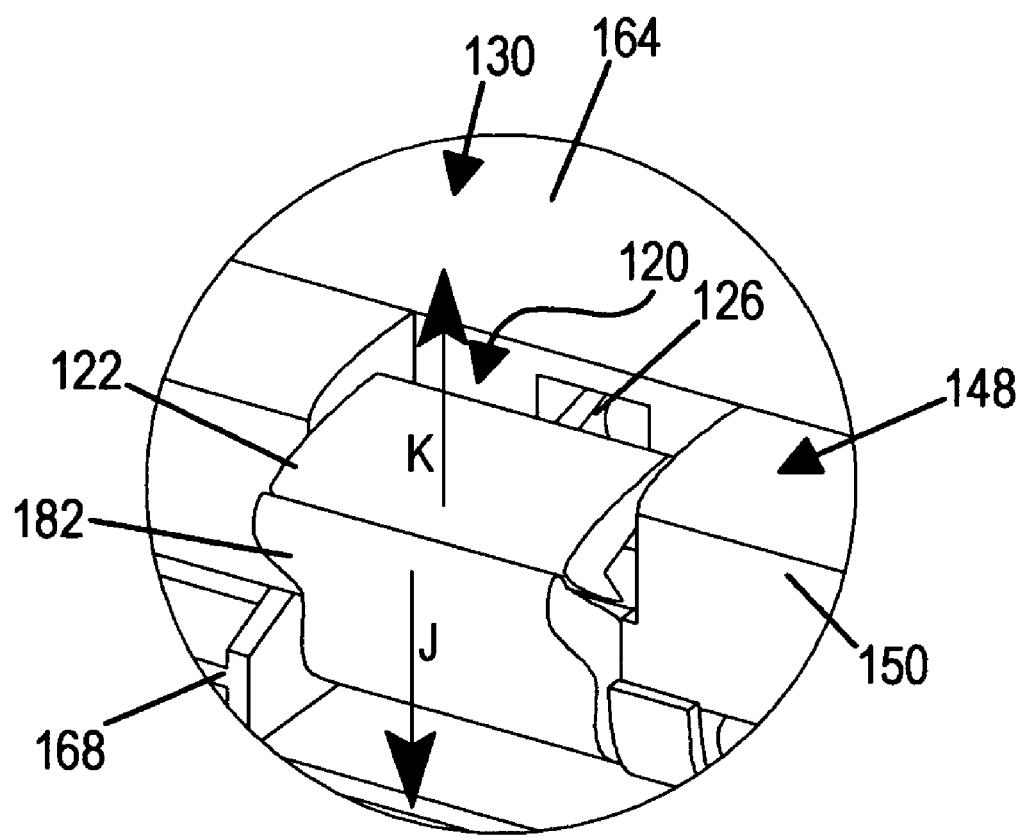
FIG. 13 is an enlarged perspective view of a portion of the electronic system shown in FIG. 1 according to an alternative embodiment of the present invention.

In an alternative embodiment, a latch guard 182 reduces access to the latch mechanism 120 when the latch guard 182 is in the position shown in FIG. 13. When the latch guard 182 is in this position, it is difficult to grip the pivoting portion 122 of the latch mechanism 120 in order to manipulate the pivoting portion 122. When the latch guard 182 is manipulated to a downward position in the direction of arrow J, access to the latch mechanism 120 is uninhibited, so the pivoting portion 122 can then be manipulated in the direction of arrow K as described above. The latch guard 182, thus, guards against accidental manipulation of the pivoting portion 122.

We claim:

1. An electronic system comprising:
   a housing;
   a drawer configured to be inserted into and extended at least partially out of the housing, and having a handle for pulling the drawer at least partially out of the housing and a door configured to open to expose an interior of the drawer when the drawer is extended at least partially out of the housing; and
   a latch mechanism mounted on the drawer and having a first position at which the handle and the door can be secured, a second position at which the handle is not secured and the door can be secured, and a third position at which the door is not secured.

2. An electronic system as defined in claim 1, wherein:
   at the first position, the latch mechanism can secure the handle in a stowed position at which the handle is not used for pulling the drawer out of the housing and the door can be in a closed position at which the interior of the drawer is at least partially shielded.

3. An electronic system as defined in claim 1, wherein:
   manipulating the latch mechanism from the first position to the second position causes the latch mechanism to release the handle from the stowed position.

4. An electronic system as defined in claim 1, wherein:
   the latch mechanism includes a latch spring that can engage the door in a closed position; and
   manipulating the latch mechanism from the second position to the third position causes the latch spring to release the door.

5. An electronic system as defined in claim 1, wherein:
   at least a portion of the latch mechanism pivots between the first, second and third positions.

6. An electronic system as defined in claim 1, further comprising:
   a latch guard adjacent to the latch mechanism and having a first position at which access to the latch mechanism is at least partially inhibited and a second position at which access to the latch mechanism is uninhibited.

7. An electronic system as defined in claim 1, wherein:
   when the handle is secured, a portion of the handle secures the drawer at an inserted position in the housing of the electronic system.

8. An electronic system as defined in claim 7, wherein:
   when the handle is released, manipulation of the handle releases the drawer from the inserted position, which allows for the drawer to be pulled at least partially out of the housing of the electronic system.

9. An electronic system comprising:
   a means for housing components of the electronic system;
   a means for containing at least some of the components and that is capable of movement at least partially into and out of the housing means;
   a means for shielding an interior of the containing means;
   a means for gripping the containing means and causing the containing means to move at least partially out of the housing means; and
   a means for latching the gripping means in a stowed position and the shielding means in a closed position;
   and wherein:
   manipulation of the latching means in a first manner releases the gripping means allowing for operating the gripping means to move the containing means at least partially out of the housing means; and
   manipulation of the latching means in a second manner releases the shielding means allowing for opening the shielding means and accessing the interior of the containing means.

10. An electronic system as defined in claim 9, wherein:
    manipulating the latching means from a first position to a second position causes the latching means to release the gripping means from the stowed position.

11. An electronic system as defined in claim 9, wherein:
    manipulating the latching means from a second position to a third position causes the latching means to operate a means for releasing the shielding means.

12. An electronic system as defined in claim 9, further comprising:
    a means for guarding the latching means against manipulation thereof when the guarding means is in a first position and allowing access to manipulate the latching means when the guarding means is in a second position.

13. An electronic system as defined in claim 9, wherein:
    the gripping means includes a means for securing the containing means at an inserted position within the housing means when the gripping means is in the stowed position.

14. A method for accessing a portion of an interior of an electronic system comprising:
    manipulating a latch mechanism to release a handle attached to a drawer disposed within a housing of the electronic system;
    shifting the handle from a stowed position to an operable position;
    operating the handle to extend the drawer at least partially out of the housing;
    further manipulating the latch mechanism to release a door that obscures an interior of the drawer; and
    shifting the door to expose the interior of the drawer.

15. A method as defined in claim 1, wherein:
    manipulating the latch mechanism to release the handle involves pivoting at least a portion of the latch mechanism from a first position to a second position; and further manipulating the latch mechanism to release the door involves pivoting at least the portion of the latch mechanism from the second position to a third position.

16. A method as defined in claim 1, wherein:

the manipulating of the latch mechanism releases the handle from a grip of the latch mechanism; and the latch mechanism includes a latch spring, which upon the further manipulating of the latch mechanism, releases the door from a grip of the latch spring.

17. A method as defined in claim 1, wherein:

a latch guard adjacent to the latch mechanism reduces access to the latch mechanism when the latch guard is in a first position;

and further comprising:

manipulating the latch guard to a second position at which access to the latch mechanism is uninhibited prior to manipulation of the latch mechanism.

18. A method as defined in claim 1, wherein:

shifting of the handle from the stowed position to the operable position releases the drawer from an inserted position in the housing.

19. A method as defined in claim 1, further comprising:

shifting the door to obscure the interior of the drawer and cause the latch mechanism to secure the door in a closed position;

manipulating the drawer to insert the drawer at least partially into the electronic system; and shifting the handle from the operable position to the stowed position to cause the latch mechanism to secure the handle in the stowed position.

20. A method as defined in claim 19, wherein:

the shifting of the handle from the operable position to the stowed position cams the drawer securely into an inserted position in the housing.

* * * * *

UNITED STATES PATENT AND TRADEMARK OFFICE
CERTIFICATE OF CORRECTION

PATENT NO.        : 7,558,075 B2                                Page 1 of 1
APPLICATION NO.   : 11/389787
DATED             : July 7, 2009
INVENTOR(S)       : Minh H. Nguyen et al.

It is certified that error appears in the above-identified patent and that said Letters Patent is hereby corrected as shown below:

In column 3, line 13, delete "1/0" and insert -- I/O --, therefor.

In column 6, line 64, in Claim 15, delete "claim 1" and insert -- claim 14 --, therefor.

In column 7, line 4, in Claim 16, delete "claim 1" and insert -- claim 14 --, therefor.

In column 7, line 11, in Claim 17, delete "claim 1" and insert -- claim 14 --, therefor.

In column 8, line 1, in Claim 18, delete "claim 1" and insert -- claim 14 --, therefor.

In column 8, line 5, in Claim 19, delete "claim 1" and insert -- claim 14 --, therefor.

Signed and Sealed this

Twenty-fourth Day of November, 2009

David J. Kappos
*Director of the United States Patent and Trademark Office*